United States Patent [19]

Windeln et al.

[11] Patent Number: 5,145,756
[45] Date of Patent: Sep. 8, 1992

[54] METHOD FOR MAKING A HOLOGRAPHIC MIRROR

[75] Inventors: Wilbert Windeln, Heinsberg; Manfred-Andreas Beeck, Gifhorn; Norbert Bartonitscheck, Stolberg, all of Fed. Rep. of Germany

[73] Assignee: Saint-Gobain Vitrage, Courbevoie, France

[21] Appl. No.: 731,351

[22] Filed: Jul. 15, 1991

Related U.S. Application Data

[63] Continuation of Ser. No. 255,685, Oct. 11, 1988, abandoned.

[30] Foreign Application Priority Data

Oct. 12, 1987 [DE] Fed. Rep. of Germany ....... 3734438

[51] Int. Cl.$^5$ .............................................. G03H 1/04
[52] U.S. Cl. ........................................... 430/1; 430/2; 359/28; 359/32
[58] Field of Search ............... 430/1, 2; 350/3.6, 3.85, 350/3.67, 3.7, 3.25, 3.69, 3.81

[56] References Cited

U.S. PATENT DOCUMENTS

| | | | |
|---|---|---|---|
| 3,551,018 | 12/1970 | Stetson | 350/3.5 |
| 4,213,193 | 7/1980 | Reid et al. | 356/125 |
| 4,235,504 | 11/1980 | Ikeda et al. | 350/3.71 |
| 4,395,088 | 7/1983 | Firth et al. | 350/3.7 |
| 4,714,309 | 12/1987 | Woodcock et al. | 350/3.7 |

FOREIGN PATENT DOCUMENTS

| | | |
|---|---|---|
| 216692 | 4/1987 | European Pat. Off. . |
| 3136946 | 3/1983 | Fed. Rep. of Germany . |
| 2133574 | 7/1984 | United Kingdom . |

*Primary Examiner*—Ellis P. Robinson
*Assistant Examiner*—Donald J. Loney
*Attorney, Agent, or Firm*—Pennie & Edmonds

[57] ABSTRACT

A holographic mirror is made by a process of continuous exposure. For this purpose, a photosensitive layer (10) is exposed strip by strip in a direction crosswise to that in which the layer is exposed by two interfering beams (6, 6'). Film (11) bearing photosensitive layer (10) is continuously moved in the longitudinal direction (F) at a speed that ensures sufficient exposure of the layer. The procedure makes it possible to produce holograms of any length in one direction.

11 Claims, 4 Drawing Sheets

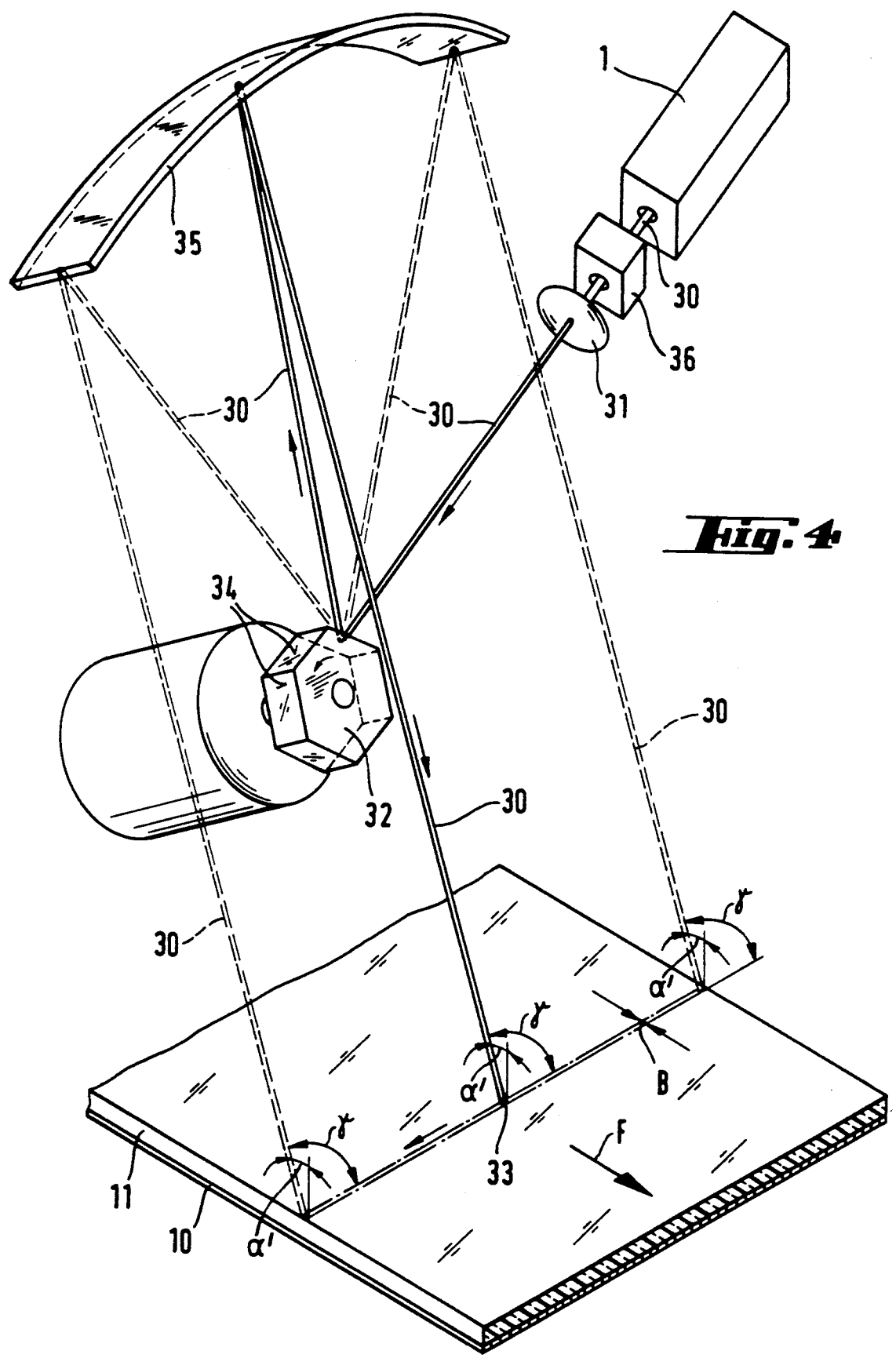

METHOD FOR MAKING A HOLOGRAPHIC MIRROR

This is a continuation of application Ser. No. 07/255,685, filed Oct. 11, 1988 is now abandoned.

BACKGROUND OF THE INVENTION

This invention relates to a method and apparatus for producing a holographic mirror by exposing a photosensitive layer to at least two interfering beams of coherent radiation so as to produce an interference structure in the interior of the photosensitive layer and parallel to its surface. As is known in the art, the interference structure is a standing wave, which in visible light can be seen as an array of fringes spaced at a distance that is a function of the wavelength of the interfering beams. The fringes are the loci of points in the two interfering beams having equal phase difference.

After exposure of the photosensitive layer to the interfering beams, the layer is developed in a known way to form a relatively permanent record of the standing wave which functions as a holographic mirror. Photosensitive layers of dichromated gelatin have proven particularly satisfactory for making such holographic mirrors.

In known processes of making holographic mirrors, a photosensitive layer is placed on a flat, transparent substrate, parallel to a mirror. It is exposed over its entire surface to a suitable laser beam that extends in two dimensions to cover such surface. The laser beam passes through the photosensitive layer and the substrate a first time and is reflected by the mirror so that it again passes through the photosensitive layer where it interferes with itself to form the desired standing wave. It is customary in the art to refer to the first laser beam as the reference beam and the reflected beam as the object beam.

This known process presents many drawbacks when making homogeneous holographic mirrors. For example, when producing extended holograms, it is extraordinarily difficult to keep the distance between the photosensitive layer and the surface of the mirror constant within the required precision throughout the exposure period. If it is desired to make a hologram having uniform reflective properties, this distance must be kept uniform over the entire surface with a precision on the order of fractions the wavelength of the illuminating laser beam because minute variations in this distance during the exposure time lead to changes in the position of the standing wave in the photosensitive layer and consequently obliteration or fading of the record that is made of the standing wave. Further, the maximum possible size of the hologram thus obtained is limited by the fact that it is difficult to achieve homogeneous illumination over large areas. Illumination can be performed segment by segment by exposing individual surface elements successively, but in this case it is inevitable that seams will become visible and bothersome.

Some fields of use require relatively extended, homogeneous holographic mirrors. For example, an automobile windshield may be equipped with such a holographic mirror, either on its entire surface or on a part of it, as descried in DE-OS 31 36 946. In this case, the hologram must be formed to reflect white light such as solar radiation from above while, in the horizontal direction, the light rays must pass through unimpeded. In addition, such holographic mirrors have also been formed and used in such a way as to make signals or optical information visible in the field of vision of the driver as described in EP 216 692.

SUMMARY OF THE INVENTION

Accordingly, an object of the invention is to develop a simplified and improved process for making extended holographic mirrors.

According to the invention, this object is achieved by illuminating a photosensitive layer in lines or strips using at least one laser beam. At the same time, the photosensitive layer and the laser beam are continuously moved relative to one another in a crosswise direction at a speed that guarantees sufficient illumination of said layer.

According to the improved process, one method uses a divergent, static laser beam to form on the photosensitive layer, a light strip extending in a first direction.

A second method uses a laser beam that forms a small light spot on the photosensitive layer that is dynamically deflected by a light deflection system in a direction different from that of the relative movement of the laser and the photosensitive layer.

In the process according to the invention, the creation of the standing wave in the photosensitive layer is not performed in a purely static manner by extended exposure of the entire surface but rather, in a continuous manner by illumination of a portion of the entire surface and by continuous relative movement between the laser beam and the photosensitive layer. The relative speed of the photosensitive layer and the beam, as well as the intensity and the width or diameter of the laser beam must then be matched so that the necessary light energy is applied to the photosensitive layer. Due to the continuous relative movement between the laser beam and the photosensitive layer, it is possible to make holograms of practically unlimited length in this manner.

The speed of the relative movement between the laser beam and the photosensitive layer in its longitudinal direction is limited by the intensity of the laser that produces the light beam. To further increase the speed of the relative movement, the photosensitive layer can be exposed to beams from several lasers simultaneously. In this case, however, care must be taken that the interference structures produced by the various lasers do not mutually obliterate themselves. Such is the case with most continuous wave lasers. However, an argon ion laser offers a width of the amplification line of about 6 GHz. In this way, the interference structures of various lasers spaced a maximum of several millimeters from the reflecting interface differ by less than 1/10 of the interfringe distance.

In contrast to the rigorous dimensional stability required in known static exposure processes, the only requirement of great stability in the present invention is imposed on the distance separating the photosensitive layer from the reflection surface. This proves to be incomparably simpler than keeping this distance precise over the entire surface of the hologram. For this reason, the process according to the invention makes it possible to make holographic mirrors that are much more uniform than those obtained with known processes.

A reflecting surface placed parallel to the photosensitive layer can be used in a known way to produce the reflected beam which interferes with the reference beam to form the standing wave in the photosensitive layer. In the process according to the invention, the exposure is performed only in a line or strip. To produce the reflected beam, a mirror can be used having a surface curved in the direction of movement of the photosensitive layer, such as one with a cylindrical shape. In such a case, the surface of the mirror preferably is optically coupled by an index liquid to the photosensitive layer or to the support film of the photosensitive layer.

According to another advantageous development of the invention, the distance between the photosensitive layer and the reflecting surface is kept constant by making the interface between the photosensitive layer and the air or, if applicable, the interface between the support film and the air, serve as a reflection surface. This can be accomplished, for example, by using a light beam that is incident on the interface at an angle greater than the critical angle so that total internal reflection occurs. As a result, there is no need for any additional mirror surface for production of the reflected wave; and all relative translational movements between the photosensitive layer and the reflecting surface are avoided.

When illumination is performed such that the angle of incidence is small, (i.e., less than the critical angle of total reflection), then the amount of reflection at the interface (i.e., the free surface of the photosensitive layer or support film) can be increased by contacting the surface with a reflecting liquid such as, for example, mercury. In this way also the reflected wave is created at the interface between the photosensitive layer and the mercury or between the support film and the mercury.

Another advantage of the new process over known processes lies in the fact that optical defects in the photosensitive layer or in the substrate, such as inclusions or bubbles, as well as surface defects, such as scratches and dust, do not produce holographic images of these defects which amplify them even more. In addition, the optical quality of the holographic mirrors produced according to this new process is improved.

BRIEF DESCRIPTION OF THE DRAWINGS

These and other objects, features, characteristics and advantages of the process will be more readily apparent from the subsequent description of various embodiments of this new process in which:

FIG. 4 illustrates an assembly for executing the process according to a fourth embodiment of the invention.

DESCRIPTION OF PREFERRED EMBODIMENT

Figure 1:
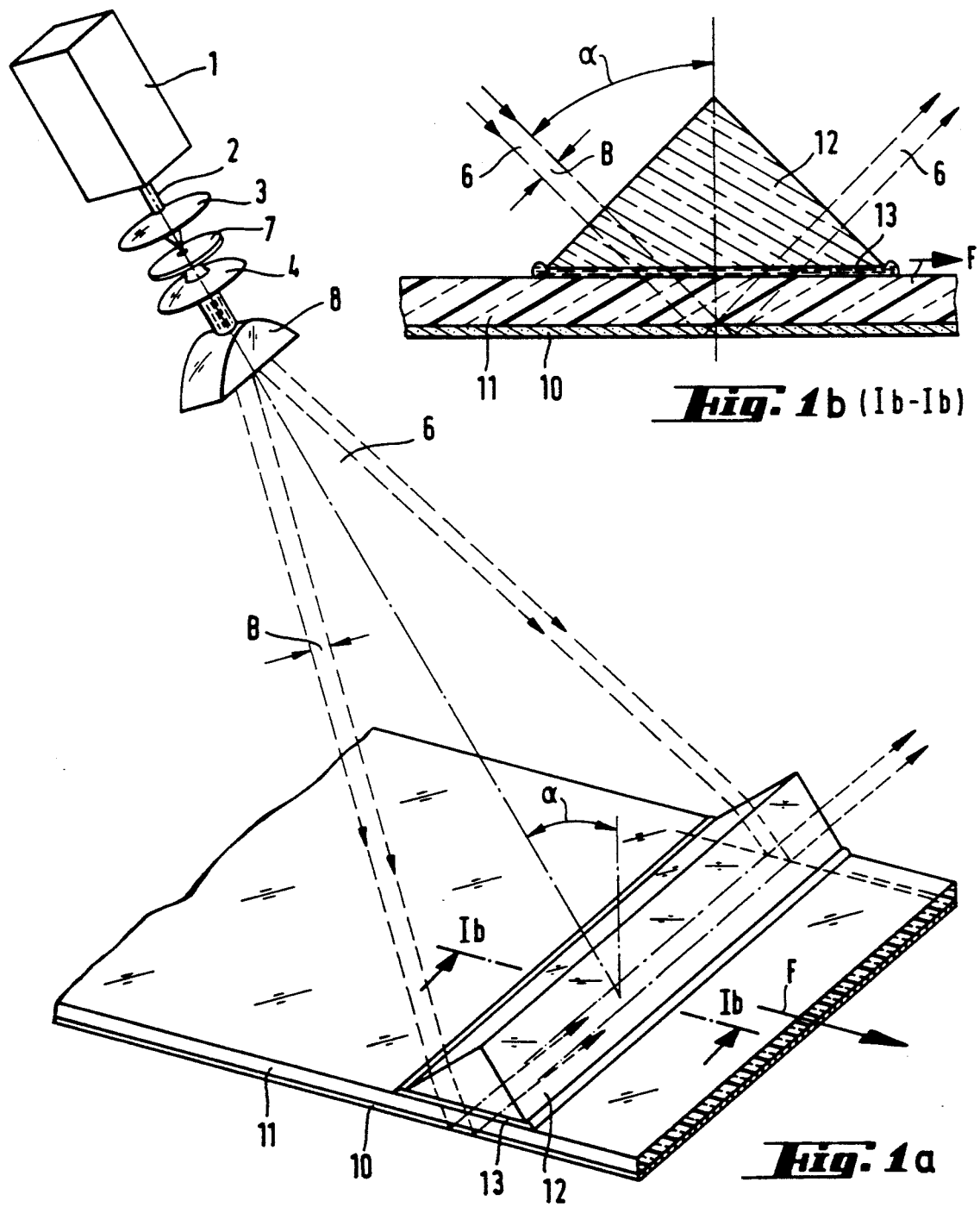
FIG. 1a and 1b illustrate an assembly for executing the process according to a first embodiment of the invention.
Figure 2:
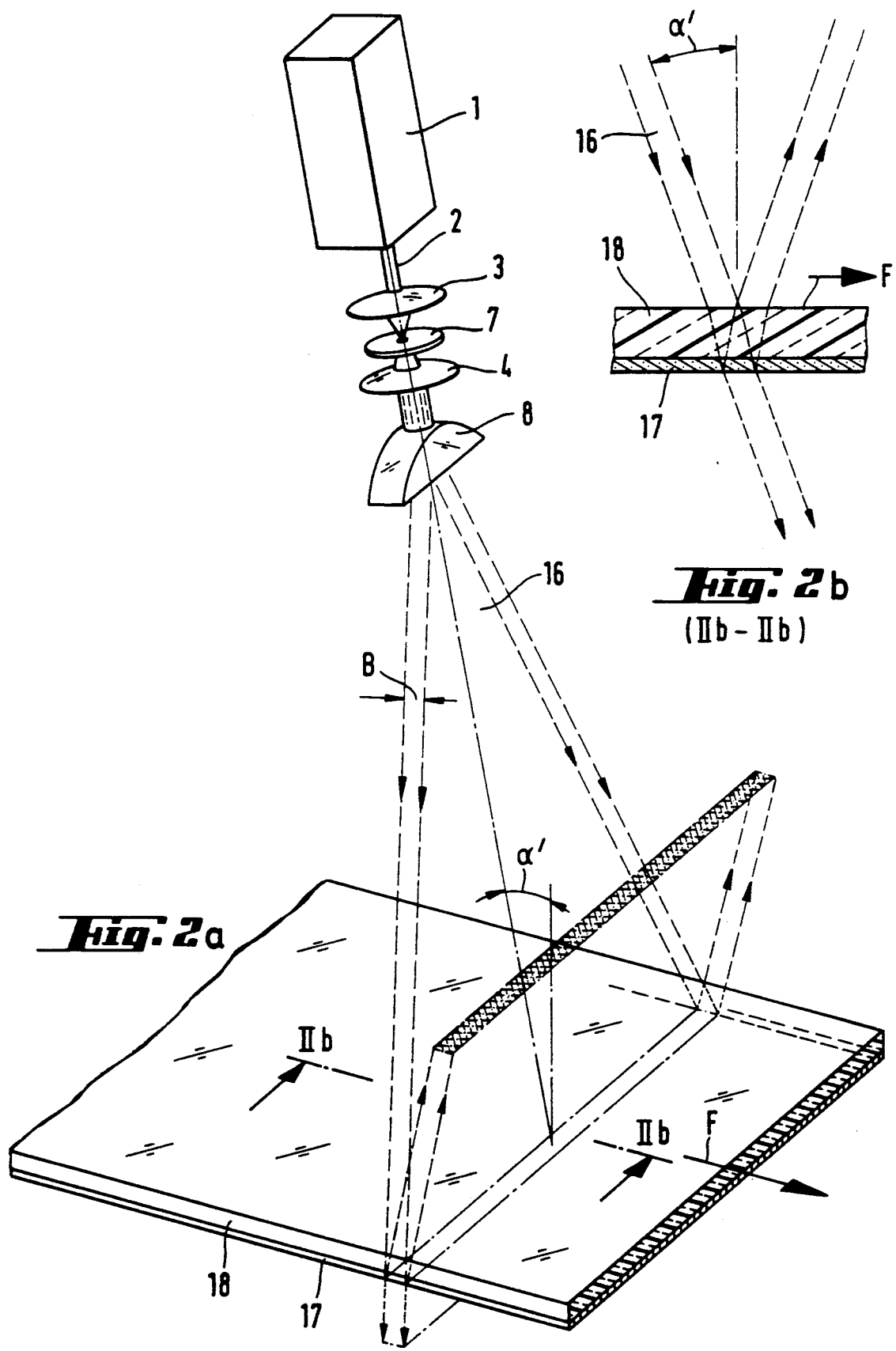
FIG. 2a and 2b illustrate an assembly for executing the process according to a second embodiment of the invention.

The apparatus shown in FIGS. 1a and 2a is similar and like elements are identified by the same number. As shown in these figures, the apparatus comprises a continuous wave laser 1, lenses 3, 4, a diaphragm 7 and a cylindrical lens 8. The laser emits a laser beam 2 which has a cross-section that is increased in a uniform manner by passing the beam through a beam expander comprising lenses 3 and 4 and diaphragm 7. Lenses 3 and 4 are separated by the sum of their focal lengths and diaphragm 7 is located in the common focal plane between the lenses.

The expanded laser beam from lens 4 strikes cylindrical lens 8 which diverges the beam in one direction to form a beam 6 in FIG. 1a and a beam 16 in FIG. 2a which is incident on photosensitive layers 10, 17, respectively. In each case beams 6, 16 have a thickness B and a width that is equal to the width of the photosensitive layer. Photosensitive layers 10, 17, which may be made from dichromated gelatin, are formed as a thin film on suitable transparent support 11, 18 respectively.

The photosensitive layer and its support are moved relative to the incident laser beam in the direction F by a suitable transport means (not shown). Cylindrical lens 8 is oriented so that the lines formed by the intersection of incident beam 6 with photosensitive layer 10 (FIG. 1a) and incident beam 16 with photosensitive layer 17 (FIG. 2a) are at non-zero angles with the direction of movement F of the photosensitive layer. Advantageously, as shown in FIGS. 1a and 2a, the angles between the intersection lines and the direction of movement are right angles.

As shown more clearly in FIGS. 1b and 2b, the incident beam first passes through a support film 11 (FIG. 1b) or 18 (FIG. 2b) and then the photosensitive layer. After passing through the photosensitive layer, the beams are reflected back through the photosensitive layer and support film; and the reflected beam (designated 6' in FIG. 1b and 16' in FIG. 2b) emerges from the layer and film on the same surface it originally entered. As also shown in FIGS. 1b and 2b,, the incident beam advantageously is reflected at the free surface (the lower surface in the drawings) of the photosensitive layer. This procedure avoids the defects which would inevitably be produced during the movement of the photosensitive layer if the reflection surface were placed at a distance from the surface of the photosensitive layer.

As will be appreciated by those skilled in the art, the incident beam (sometimes referred to in the art as the reference beam) and the reflected beam (or object beam) are coherent beams of electromagnetic radiation which interfere with one another to set up a standing wave pattern. This standing wave pattern is recorded in the photosensitive layers 10, 17. As is well known, in visible light the standing wave pattern is seen as an array of interference fringes oriented parallel to one another and spaced apart by a distance $d = \lambda/(2 \cos \theta/2)$ where $\lambda$ is the wavelength of the laser beam and $\theta$ is the angle between the incident beam and the reflected beam.

Where the incident beam is reflected by a surface that is parallel to the photosensitive layer as in FIGS. 1b and 2b, the fringes are aligned parallel to the major surfaces of the photosensitive layer and the angles $a,a'$, between the incident beam and a normal to the photosensitive layer are equal to the angles between the reflected beam and the normal to the photosensitive surface. Thus, for the specific embodiment shown in FIGS. 1b and 2b, $a = \theta/2$ and the spacing between the fringes recorded in the photosensitive layer is a function of the incident angle and the wavelength of the incident laser beam.

By modifying the angle of incidence $a$, the reflective properties of the hologram mirror can be matched to the wavelength of the light that is primarily to be reflected.

Holographic mirrors may also be produced which have reflective properties which vary locally over the width of the hologram. This can be achieved, for example, by placing in the path of the incident laser beam, an absorption filter having light absorption properties which vary across the filter. In this manner, a band of light with a desired intensity profile is obtained on the photosensitive layer. Another manner of making an endless holographic mirror with a varying intensity profile consists of associating, side by side, several incident laser beams coming from lasers with different wavelengths.

In the case illustrated in FIGS. 1a and 1b, the angle of incidence α is large enough that total internal reflection takes place at the free surface of the photosensitive layer. In this case, beam 6 is introduced into support film 11 by a prism 12 that is coupled optically to support film 11 by a suitable index liquid 13.

Support film 11 and photosensitive layer 10 move at a uniform speed in the direction of arrow F. The speed of movement is selected so that, taking into account the intensity of beam 6 upon incidence with layer 10, the photosensitive layer 10 is correctly exposed.

The assembly illustrated in FIG. 2a and 2b is suitable for the case in which laser beam 16 is incident on support film 18 such that total internal reflection does not take place at the free surface of the photosensitive layer. In this case the laser beam penetrates support film 18 directly.

Because the angle of incidence α is relatively small, most of incident beam 16 emerges from photosensitive layer 17. Only a small part of beam 16 is reflected at the free surface between the photosensitive layer and air to produce reflected beam 16' for the production of the standing wave.

However, where an appropriate photosensitive layer is used such as dichromated gelatin, only a very small ratio of intensity of the reflected beam to the incident beam is sufficient to produce efficient holographic mirrors whose reflection of light is higher than 99% for wavelengths near those that meet the Bragg condition.

Alternatively, a suitable reflecting surface such as a flat or a curved cylindrical surface can be provided at or below the otherwise free surface between the photosensitive layer and air.

Because the laser beam is incident on the photosensitive layer from the support film, the process is relatively insensitive to variations in angle of incidence during exposure. The allowable tolerance for the angle of incidence depends not only on the angle of incidence but also on the distance between the photosensitive layer and the surface that reflects the laser beam. The greater this distance, the more constant the angle of incidence must be. If, for example, the angle of incidence in the photosensitive layer is about 45° and angle variations during exposure are up to 0.1° a satisfactory hologram is obtained when the reflecting surface is at a distance of up to 20 microns from the photosensitive layer. This is because the shifts produced in the interference structure in these circumstances are less than 1/10 of the interfringe distance.

An angular tolerance of 0.1° is perfectly achievable and does not represent too strict a requirement for the mechanical design of the device. If the space between the photosensitive layer and the reflecting surface is greater, a stricter requirement would be imposed on the precision of a mechanical device suitable for this purpose.

Small variations in the angle of incidence α, such as those appearing during the movement of support film 18 and photosensitive layer 17, are not detrimental but are even advantageous in reducing or eliminating the effect of reflections at the interface between support film 18 and air. Due to the smaller angular tolerance which, in the case of reflection at the interface between the support film and the air is less than the factor d/D (d = thickness of the photosensitive layer; D = thickness of the support film), these reflections do not contribute to the formation of the hologram. In other words, the latter no longer imposes strict requirements on the mechanical guidance of support 18 bearing the photosensitive layer.

Figure 3:
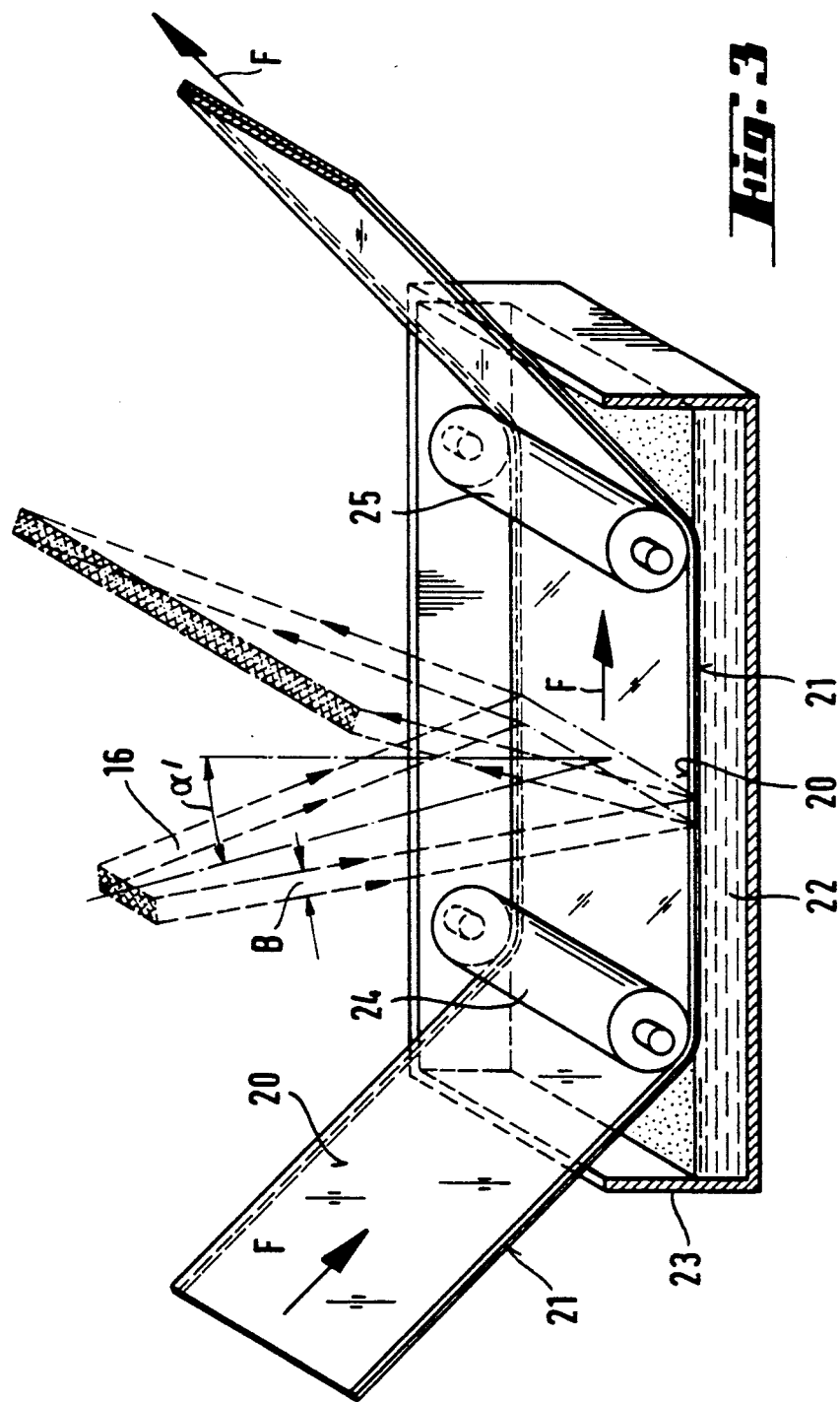
FIG. 3 illustrates an assembly for executing the process according to a third embodiment of the invention.

The assembly illustrated in FIG. 3 differs from that illustrated in FIG. 2a and 2b in that the amount of reflection at the rear face of the photosensitive layer is increased. To this end, the rear face of photosensitive layer 21 is brought into contact with a liquid having a highly reflective surface in the zone of incidence of the laser beam. For this purpose, a mercury bath 22 may be used, contained in a suitable container 23. In container 23 there are two rollers 24 and 25 installed in such a manner that the lower generatrix is located at about the level of the surface of the mercury bath. These two rollers 24 and 25, are situated to engage a support film 20 for layer 21 and hold the support film so that photosensitive layer 21 is at a level in contact with the surface of the bath. In this way, a 100% reflection is obtained at the interface between the photosensitive layer and the mercury. As a result, even for small angles of incidence α, the ratio of the intensity of the reflected beam and the incident beam is about 1.

FIG. 4 illustrates by way of example, an assembly that is suitable for execution of the process using a scanning laser beam. A laser beam 30 from laser 1 is directed through a focusing means 31 to the reflecting surface of a polygonal revolving mirror 32. Focusing means 31 determines the size of light spot 33 and thus the width B of the light path on the photosensitive layer. The axis of rotation of polygonal mirror 32 is situated such that the surface of mirror 34, which reflects laser beam 30, is located at the focal point of a concave mirror 35. As the polygonal mirror 32 rotates, laser beam 30 is scanned across concave mirror 35 and by this mirror is scanned across a film 11 bearing a photosensitive layer 10. The optical components are, in this case, shaped so that the width of light spot 33 and the angles of incidence α' and γ remain approximately constant. The scanned beam is then reflected by any technique, such as those disclosed in FIGS. 1a, 2a and 3 to produce a reflected beam that interferes with the scanning beam to produce an interference pattern that is recorded in the photosensitive layer. The scanning rate and the translational speed of film 11 in the direction of arrow F are selected so that the beam scans the entire width and length of photosensitive layer 10; and the intensity of the beam is sufficient to expose the photosensitive layer and record the reflection hologram.

When it is desired to produce a holographic mirror having reflection properties that vary in the crosswise direction and/or in the longitudinal direction of the hologram, an electro-optic modulator 36 can be inserted into the path of laser beam 30. By using this electro-optic modulator 36, the light intensity can be modified dynamically from one point to another, for example, by computer control according to a desired program.

In contrast to the case where the laser beam is projected statically, dynamic projection with a scanning laser beam offers the advantage that the total power of the laser is available for each exposed surface element of the photosensitive layer. As a result, the exposure time for each surface element is reduced drastically (by a factor of 1000 and more), so that the stability requirements for recording the hologram in each surface element became clearly less critical. While it may take as long to expose the same number of surface elements using the apparatus of FIG. 4 as it would the apparatus of the other figures, the reduced exposure time for each surface element in the case of FIG. 4 may be a substantial advantage in some applications.

As will be apparent to those skilled in the art, numerous variations are possible in the practice of the invention. For example, while the photosensitive layer and its support are depicted in an orientation in which the incident laser beam first passes through the support and then the photosensitive layer, the invention may also be practiced with the orientation reversed so that the incident beam first passes through the photosensitive layer.

What is claimed is:

1. A process of forming a holographic mirror comprising the steps of:

exposing a photosensitive layer having first and second major surfaces to first and second elongated beams of coherent electromagnetic radiation that interfere within a corresponding strip of the photosensitive layer to produce an array of fringes spaced at a distance that is a function of the wavelength of the interfering radiation, the first and second elongated beams extending the width of the photosensitive layer, the photosensitive layer being illuminated along a line in a first direction on the first major surface by at least said first and second elongated beams and the second elongated beam being produced by reflection of the first elongated beam after it passes through the photosensitive layer; and continuously moving one of the photosensitive layer and the first and second elongated beams relative to the other in a second direction at a speed such that said photosensitive layer receives sufficient illumination over the entire first major surface for the array of fringes to record a homogeneous interference structure throughout the photosensitive layer.

2. The process according to claim 1 wherein the intensity of the first elongated beam incident on different areas of the photosensitive layer is varied.

3. The process according to claim 1 wherein the first direction is at right angles to the second direction.

4. The process according to claim 1 wherein the photosensitive layer is moved continuously through the first and second elongated beams.

5. The process according to claim 1 wherein a free surface of the photosensitive layer is brought into contact with the surface of a light-reflecting liquid to increase the amount of reflection.

6. The process according to claim 5 wherein mercury is used as the light-reflecting liquid.

7. The process according to claim 1 wherein the second elongated beam is formed by total internal reflection at a surface of the photosensitive layer.

8. The process according to claim 1 wherein the second elongated beam is formed by reflection at a major surface of the photosensitive layer and the array of fringes is parallel to said major surface.

9. The process according to claim 1 wherein the first elongated beam is directed through a prism in contact with the substrate or with the photosensitive layer.

10. The process according to claim 1 wherein the photosensitive layer is formed on a transparent substrate, the first elongated beam is incident on a face of the substrate opposite the photosensitive layer and a fraction of the first elongated beam is reflected at a free surface of the photosensitive layer to form the second elongated beam for the formation of the homogeneous interference structure.

11. The process according to claim 1 wherein the intensity of the first and second elongated beams incident on different areas of the photosensitive layer is varied.

* * * * *